(12) United States Patent
Kim et al.

(10) Patent No.: US 9,331,223 B2
(45) Date of Patent: May 3, 2016

(54) SOLAR CELL MODULE AND PHOTOVOLTAIC POWER GENERATION SYSTEM INCLUDING THE SAME

(71) Applicant: LG ELECTRONICS INC., Seoul (KR)

(72) Inventors: Jeongshik Kim, Seoul (KR); Hwanyeon Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 13/944,712

(22) Filed: Jul. 17, 2013

(65) Prior Publication Data
US 2014/0137927 A1 May 22, 2014

(30) Foreign Application Priority Data
Nov. 20, 2012 (KR) ........................ 10-2012-0131738

(51) Int. Cl.
| | | |
|---|---|---|
| *E04D 13/18* | (2014.01) | |
| *E04H 14/00* | (2006.01) | |
| *H01L 31/042* | (2014.01) | |
| *H02S 30/10* | (2014.01) | |
| *F16B 37/06* | (2006.01) | |

(52) U.S. Cl.
CPC ............ *H01L 31/0424* (2013.01); *H02S 20/00* (2013.01); *H02S 30/10* (2014.12); *F16B 37/067* (2013.01); *Y02E 10/50* (2013.01)

(58) Field of Classification Search
CPC ..... H01L 31/0424; H02S 30/10; H02S 20/00; F16B 37/067; Y02E 10/50
USPC ......... 52/173.3, 764, 780, 781; 136/244, 251; 411/181, 183
See application file for complete search history.

(56) References Cited

U.S. PATENT DOCUMENTS

| | | | |
|---|---|---|---|
| 2,170,472 A | | 8/1939 | Fitch |
| 4,239,555 A | * | 12/1980 | Scharlack et al. ............ 136/251 |
| 4,692,557 A | * | 9/1987 | Samuelson et al. ........... 136/251 |
| 4,890,965 A | * | 1/1990 | Dietlein .................. F16B 39/36 411/280 |
| 4,942,865 A | * | 7/1990 | Pierce-Bjorklund ......... 126/633 |
| 5,074,726 A | | 12/1991 | Betchel et al. |
| 5,460,660 A | * | 10/1995 | Albright et al. ............... 136/251 |
| 6,172,295 B1 | * | 1/2001 | Hattori et al. ................. 136/251 |
| 6,201,180 B1 | * | 3/2001 | Meyer et al. .................. 136/244 |
| 8,156,631 B2 | | 4/2012 | Schmidt |
| 2004/0202525 A1 | * | 10/2004 | Cosenza ............... F16B 39/286 411/308 |
| 2004/0221524 A1 | | 11/2004 | Poddany et al. |
| 2006/0225267 A1 | * | 10/2006 | Wojciechowski et al. ...... 29/515 |
| 2007/0071573 A1 | * | 3/2007 | Uryu .................... F16B 39/122 411/269 |
| 2008/0110493 A1 | * | 5/2008 | Aschenbrenner ............. 136/251 |
| 2008/0193254 A1 | * | 8/2008 | Selle et al. .................... 411/188 |
| 2009/0229654 A1 | * | 9/2009 | Morita et al. ................. 136/251 |
| 2010/0126087 A1 | * | 5/2010 | Brescia et al. ............... 52/173.3 |
| 2011/0126888 A1 | * | 6/2011 | Naitoh et al. ................. 136/251 |
| 2011/0232728 A1 | | 9/2011 | Mun |

(Continued)

FOREIGN PATENT DOCUMENTS

| | | |
|---|---|---|
| DE | 2442759 A1 | 3/1976 |
| EP | 1500461 A2 | 1/2005 |

(Continued)

*Primary Examiner* — Brian Mattei
(74) *Attorney, Agent, or Firm* — Birch, Stewart, Kolasch & Birch, LLP

(57) ABSTRACT

A solar cell module is disclosed. The solar cell module includes a solar cell panel, and a frame disposed at a periphery of the solar cell panel. A fixing hole is formed at the frame. A first fastening member is coupled to the fixing hole.

11 Claims, 9 Drawing Sheets

(56) References Cited

U.S. PATENT DOCUMENTS

2011/0239546 A1* 10/2011 Tsuzuki et al. .............. 52/11
2012/0055008 A1 3/2012 Boulet et al.

FOREIGN PATENT DOCUMENTS

| | | |
|---|---|---|
| EP | 1860705 A1 | 11/2007 |
| EP | 2157620 A1 | 2/2010 |
| GB | 858982 | 1/1961 |
| JP | 62-104464 U | 7/1987 |
| JP | 3-105711 U | 11/1991 |
| JP | 4-302706 A | 10/1992 |
| JP | 10-294485 A | 11/1998 |
| JP | 2003-56147 A | 2/2003 |
| JP | 2003-78154 A | 3/2003 |
| JP | 2011-226180 A | 11/2011 |
| WO | WO 2007/065398 A1 | 6/2007 |
| WO | WO 2012/147068 A1 | 11/2012 |

* cited by examiner

SOLAR CELL MODULE AND PHOTOVOLTAIC POWER GENERATION SYSTEM INCLUDING THE SAME

CROSS-REFERENCE TO RELATED APPLICATION

This application claims priority to and the benefit of Korean Patent Application No. 10-2012-0131738, filed on Nov. 20, 2012 in the Korean Intellectual Property Office, the disclosure of which is incorporated herein by reference.

BACKGROUND OF THE INVENTION

1. Field of the Invention

Embodiments of the invention relate to a solar cell module and a photovoltaic power generation system including the same, and more particularly to a solar cell module with an improved coupling structure and a photovoltaic power generation system including the same.

2. Description of the Related Art

Recently, as existing energy resources such as petroleum and coal are depleted, interest in alternative energy sources is increasing. In particular, a solar cell which directly converts solar energy into electric energy is highlighted as a next-generation alternative energy source.

Solar cell modules each including a plurality of solar cells are fixed to a trestle (or a rack) or the like, to form a photovoltaic power generation system. Conventionally, a plurality of holes are formed through the trestle, and a plurality of holes are also formed through each solar cell module. A fastening member is disposed at an outside of the trestle, and another fastening member is disposed at an inside of the trestle. In this state, the fastening members are assembled to fasten the solar cell module to the trestle.

In this instance, however, the assembly process is troublesome because a worker must perform assembly of individual fastening members after disposing one fastening member at the outside of the trestle and disposing another fastening member at the inside of the trestle. As a result, time and costs to couple the solar cell modules to the trestle are increased. Furthermore, when an external impact is applied to the assembly of the solar cell modules and trestle or vibrations are continuously applied to the assembly, the fastening members are easily loosened. In this instance, the solar cell modules may be damaged. Otherwise, the electricity generation rate of the solar cell modules may be reduced.

SUMMARY OF THE INVENTION

Therefore, the embodiments of the invention has been made in view of the above problems, and it is an object of the embodiments of the invention to provide a solar cell module having a structure capable of achieving simplification of a coupling process and coupling stability, thereby achieving an enhancement in photoelectric transformation efficiency and an enhancement in stability, and a photovoltaic power generation system including the same.

In accordance with an aspect of the invention, the above and other objects can be accomplished by the provision of a solar cell module including a solar cell panel, and a frame disposed at a periphery of the solar cell panel, wherein a fixing hole is formed at the frame, and a fastening member is coupled to the fixing hole.

In accordance with another aspect of the invention, there is provided a photovoltaic power generation system including a solar cell module comprising a solar cell panel, and a frame disposed at a periphery of the solar cell panel, a support member for supporting the solar cell module, and a fastener for fastening the solar cell module and the support member to each other, wherein the fastener includes a first fastening member coupled to a fixing hole formed at the frame, and a second fastening member connected to the support member and fastened to the first fastening member.

BRIEF DESCRIPTION OF THE DRAWINGS

The above and other objects, features and other advantages of the embodiments of the invention will be more clearly understood from the following detailed description taken in conjunction with the accompanying drawings, in which.

DETAILED DESCRIPTION OF THE EMBODIMENTS

Figure 1:
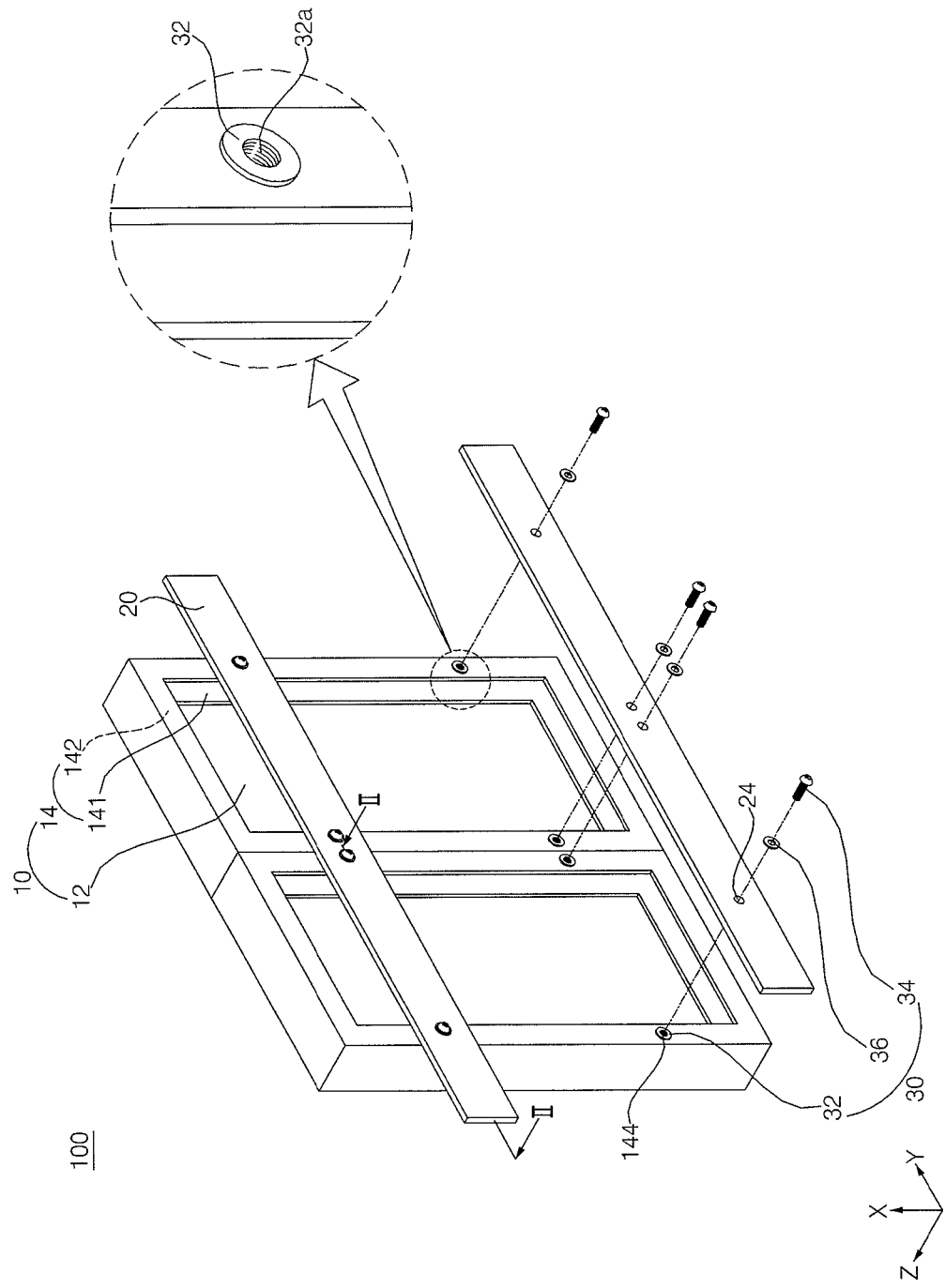
FIG. 1 is an exploded rear perspective view illustrating a photovoltaic power generation system according to an example embodiment of the invention.

Reference will now be made in detail to the preferred embodiments of the invention, examples of which are illustrated in the accompanying drawings. These embodiments are not intended to limit the embodiments of the invention. Other embodiments may also be provided.

Constituent elements other than elements constituting essential features of the embodiments of the invention may be omitted from the drawings, for clarity of description. Like reference numerals refer to like elements throughout. In the drawings, the widths, thicknesses, etc., of constituent elements may be exaggerated or reduced for clarity and convenience of illustration. The embodiments of the invention are not limited to the illustrated thicknesses, widths, etc.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, in the description of embodiments, it will be understood that when a layer (or film), a region, a pad, a pattern or a structure is referred to as being disposed 'on/above/over' another layer, region, pad, pattern or substrate, it can be directly in contact with another layer, region, pad, pattern or substrate, or one or more intervening layers, regions, pads, patterns or structures may also be present. In addition, it will also be understood that when a layer (or film), a region, a pad, a pattern or a structure are referred to as being disposed 'between' two layers, two regions, two pads, two patterns or two structures, it can be the only layer, region, pad, pattern or structure between the two layers, the two regions, the two pads, the two patterns and the two structures or one or more intervening layers, regions, pads, patterns or structures may also be present.

Hereinafter, a support frame for a photovoltaic power generation system according to an example embodiment of the invention and a photovoltaic power generation system including the same will be described in detail with reference to the accompanying drawings.

Figure 2:
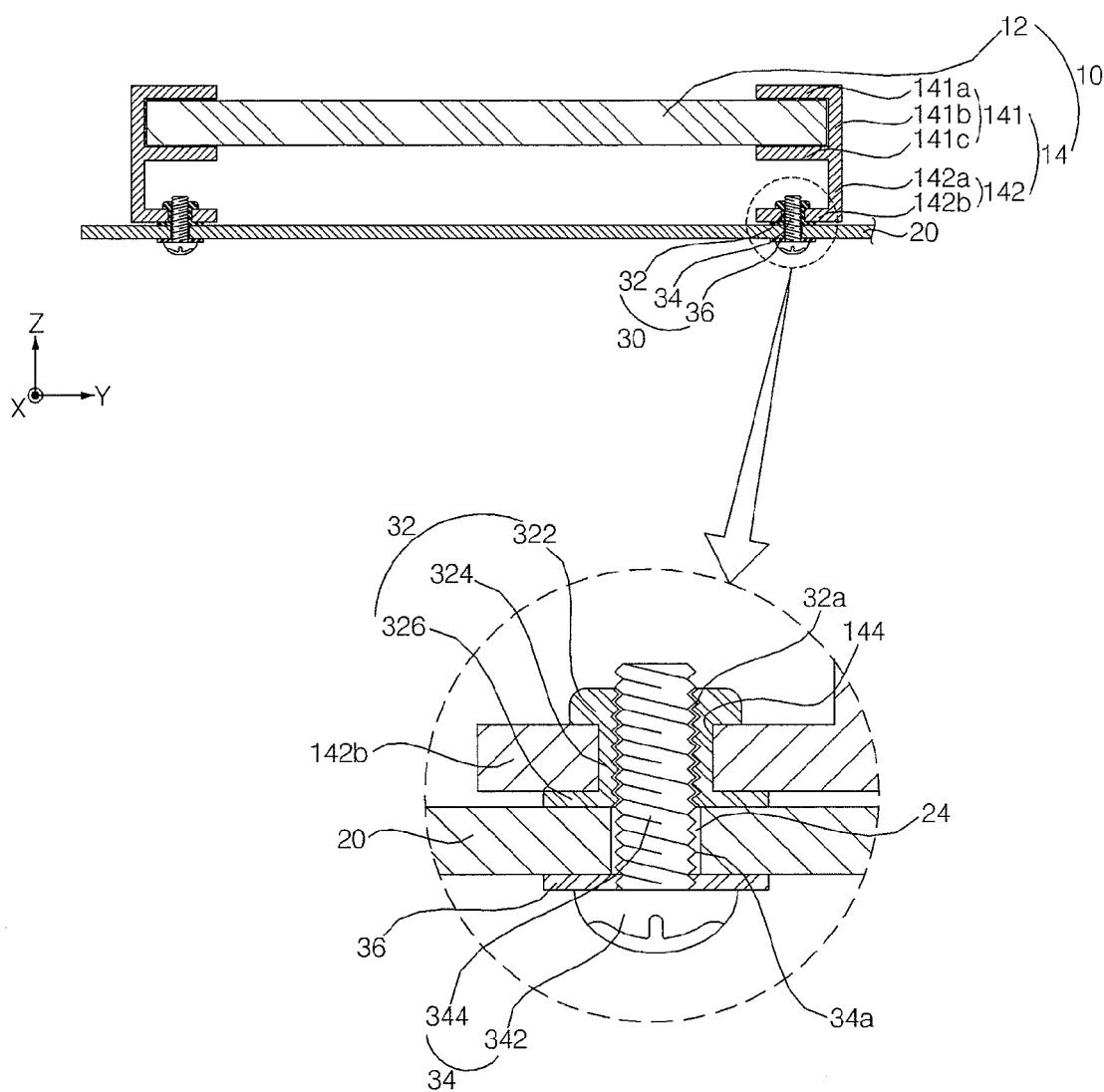
FIG. 2 is a cross-sectional view taken along the line II-II of FIG. 1.

FIG. 1 is an exploded rear perspective view illustrating a photovoltaic power generation system according to an example embodiment of the invention. FIG. 2 is a cross-sectional view taken along the line II-II of FIG. 1.

Referring to FIGS. 1 and 2, the photovoltaic power generation system of the illustrated embodiment, which is designated by reference numeral "100", includes solar cell modules 10, and support members 20, to which the solar cell modules 10 are fixed by fasteners 30. In the illustrated embodiment, each fastener 30 includes a first fastening member 32 fixed to the corresponding solar cell module 10 such that the first fastening member 32 is undetachably fixed to the solar cell module 10, and a second fastening member 34 is fastened to the first fastening member 32 while extending through the solar cell module 10 and the corresponding support member 20. This will be described in more detail.

Each solar cell module 10 may include a solar cell panel 12 including at least one solar cell. The solar cell panel 12 may include a seal to seal the solar cell, and a base plate to protect the solar cell.

For example, the solar cell may be a silicon solar cell, a dye-sensitive solar cell, a compound semiconductor solar cell, a random type solar cell, a thin film solar cell, etc. The seal functions to prevent the influence of moisture or oxygen on the solar cell. The seal may be made of various materials. For example, the seal may be an ethylene vinyl acetate (EVA) copolymer resin film. The base plate functions to protect the solar cells from external impact. The base plate may exhibit excellent light transmittance because it is disposed at the side of a light receiving surface of the solar cell panel. Of course, the embodiments of the invention are not limited to the above-described structure. Solar cells of various kinds and types may be applied to the embodiments of the invention. In addition, various combinations of such solar cells may be applied to the embodiments of the invention.

In order to stably fix the solar cell panel 12, which has a multilayer structure, a frame 14 may be provided to surround a periphery of the solar cell panel 12. Although the frame 14 is shown as surrounding the entirety of the periphery of the solar cell panel 12, the embodiments of the invention are not limited thereto. Thus, various alternatives may be employed. For example, the frame 14 may surround only a portion of the solar cell panel 12.

In the illustrated embodiment, the frame 14 may include a first frame 141 for receiving at least a portion of the solar cell panel 12, and a second frame 142 outwardly extending from the first frame 141.

In more detail, the first frame 141 may include a frame portion 141a disposed at the side of the light receiving surface of the solar cell panel 12, a frame portion 141b disposed at the side of the side surface of the solar cell panel 12, and a frame portion 141c disposed at the side of a rear surface of the solar cell panel 12. The frame portions 141a, 141b and 141c are connected to one another to form a groove for receiving the periphery of the solar cell panel 12. For example, the first frame 141 may have a "U" shape. The second frame 142 may include a vertical portion 142a extending rearwards from the first frame 141, and a parallel portion 142b extending from the vertical portion 142a in a bent state such that it extends in parallel to a rear surface of the solar cell panel 12 while being spaced from the rear surface by a certain distance. For example, the second frame 142 may have an "L" shape. Of course, the frame 14 may have various shapes, and the embodiments of the invention are not limited to the above-described structure.

The frame 14 may be fixed to the solar cell panel 12 in various manners. For example, the portion of the solar cell panel 12, which forms the periphery of the solar cell panel 12, may be constituted by an elastic body (for example, a tape having elasticity). In this instance, the periphery of the solar cell panel 12 may be fitted in the first frame 141, using the elastic body. Of course, the embodiments of the invention are not limited to the above-described structure. In accordance with the embodiments of the invention, various alternatives may be employed. For example, the constituent elements of the frame 14 may be individually assembled to the periphery of the solar cell panel 12.

The solar cell modules 10 are fixed to the support members 20 (so called "trestles") by the fasteners 30. In the illustrated embodiment, each support member 20 has a solid bar shape. In addition, the support members 20 are illustrated as being arranged in plural along longer sides of the solar cell modules 10. That is, as shown in FIG. 1, two bar-shaped support members 20 are arranged such that one support member 20 is disposed at an upper portion of a structure formed by a pair of solar cell modules 10, and the other support member 20 is disposed at a lower portion of the structure. Thus, two support members 20 correspond to the longer sides of each solar cell module 10. Of course, the embodiments of the invention are not limited to the above-described arrangement or structure. Each support member 20 may have a rectangular shape having an inner empty space or may have an "I" or "II"-shaped cross-section. Thus, each support member 20 may have various shapes.

The fasteners 30 are arranged at regions where the support members 20 are overlapped with the parallel portions 142b of the solar cell modules 10, to fasten the solar cell modules 10 to the support members 20. In the illustrated embodiment, as described above, each fastener 30 includes the first and second fastening members 32 and 34, which are fastened to each other. The first fastening member 32 is coupled to the corresponding solar cell module 10, and the second fastening member 34 is fastened to the first fastening member 32 while being connected to the corresponding support member 20. In order to achieve an enhancement in fastening force, each fastener 30 may further include an auxiliary fastening member 36.

In more detail, a first fixing hole 144 is formed through the parallel portion 142b of each second frame 142 at each of the regions where the parallel portion 142b is overlapped with the support members 20. One first fastening member 32 is coupled to the first fixing hole 144. Thus, the first fastening member 32, which is a portion of the corresponding fastener 30 for coupling the corresponding solar cell module 10 and support member 20, is disposed at the parallel portion 142b of the second frame 142 spaced from the corresponding solar cell panel 12. Accordingly, it may be possible to protect the solar cell modules 10 from impact or damage that may be applied to the solar cell panels 12 when the fasteners 30 are installed in contact with the solar cell panels 12.

In the illustrated embodiment, each first fastening member 32 may be a nut formed with threads 32a at an inner surface thereof. In more detail, each first fastening member 32 may be a lock nut formed with threads at an inner surface thereof while having a structure preventing the nut from being loosened even when external impact is applied thereto.

The first fastening member 32, which is constituted by a lock nut as described above, is coupled to the corresponding parallel portion 142b in a riveted manner such that it is fixed to the parallel portion 142b. That is, the first fastening member 32 has an integrated structure in which all portions thereof are made of the same material, and there is no welded or jointed portion.

Hereinafter, a method for coupling each first fastening member 32 to the parallel portion 142b in a riveted manner to integrate the same, and a structure of the first fastening member 32 obtained after coupling will be described with reference to FIGS. 3A to 3C.

Figure 3A:
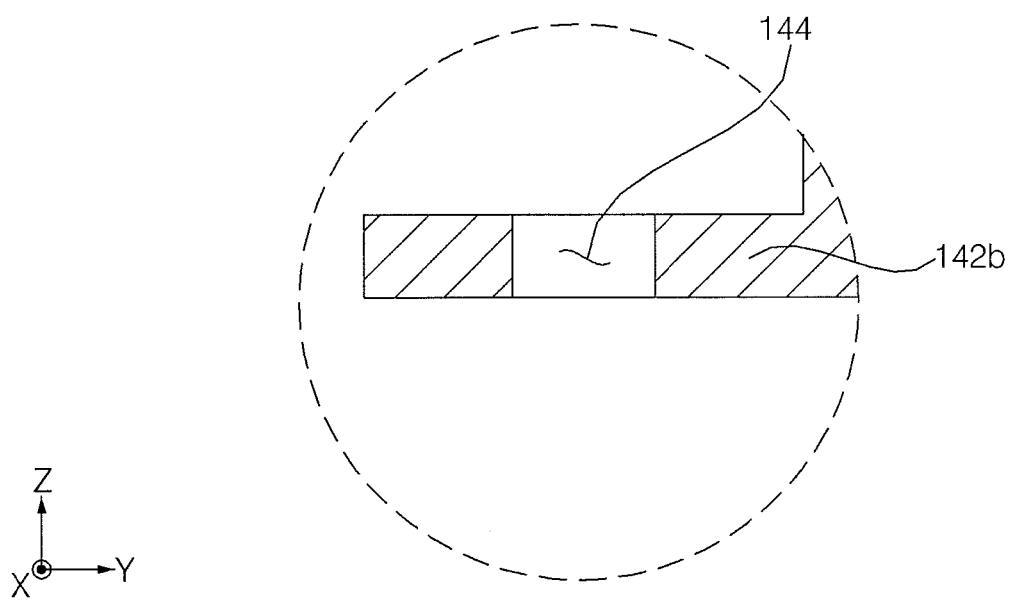
FIGS. 3A to 3C are sectional views illustrating a method for coupling a first fastening members to a solar cell module in a riveted manner to integrate the same in accordance with an embodiment of the invention.
Figure 3B:
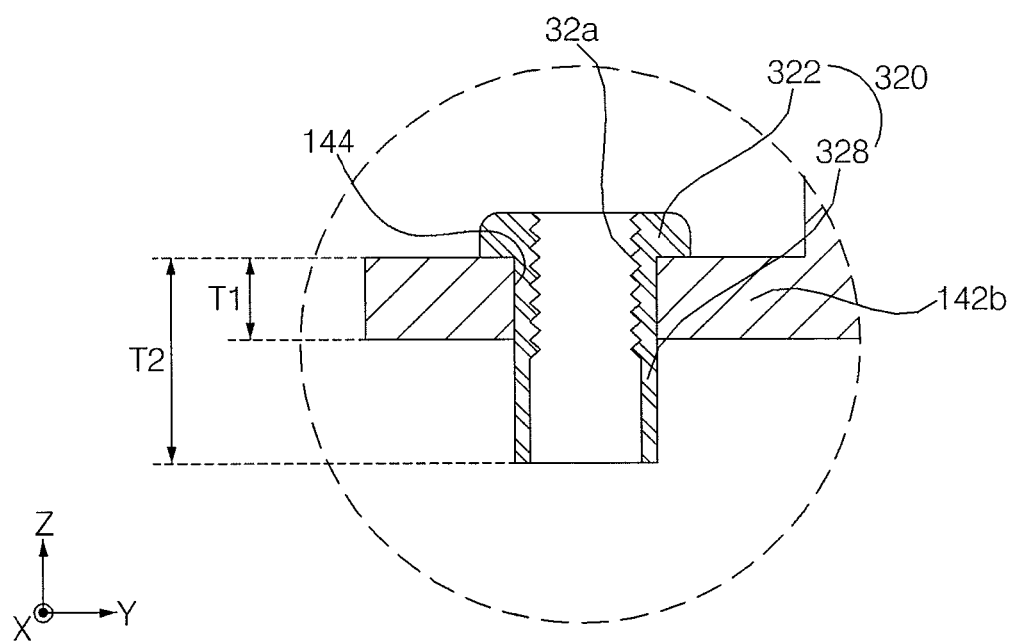
Figure 3C:
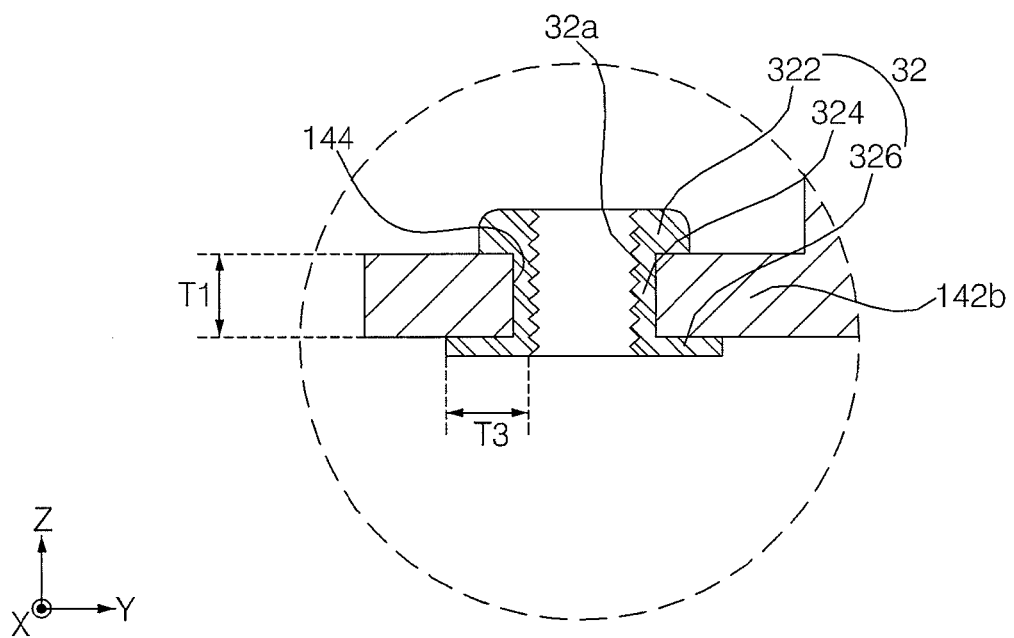

FIGS. 3A to 3C are sectional views illustrating a method for coupling the first fastening members to the solar cell module in a riveted manner to integrate the same in accordance with an embodiment of the invention.

In accordance with the illustrated method, as shown in FIG. 3A, a frame ("40" in FIG. 2), which includes a parallel portion 142b provided with first fixing holes 144, is first prepared. The following description will be given only in conjunction with one first fastening member and one first fixing hole, for simplicity of description. The first fixing hole 144 may be formed in accordance with a drilling process (for example, a drilling process using a press) after formation of the frame 14. Alternatively, the first fixing hole 144 may be formed simultaneously with formation of the frame 14 in a process of forming the frame 14.

Thereafter, as shown in FIG. 3B, a nut 320 including a nut portion 322 and an extension portion 328 is prepared. The nut 320 is then inserted into the first fixing hole 144. The nut portion 322 has a larger area (or a larger outer diameter) than the first fixing hole 144, whereas the extension portion 328 has an area (or an outer diameter) almost equal to or less than the area (or the diameter) of the first fixing hole 144. Accordingly, when the nut 320 is inserted into the first fixing hole 144, the extension portion 328 can be easily inserted into the first fixing hole 144, and the nut 320 can remain seated on a region around the first fixing hole 144 by the nut portion 322.

Threads 32a are formed at inner surfaces of the nut portion 322 and extension portion 328. Since the extension portion 328 has a length T2 greater than a thickness T1 of the parallel portion 142b, it is outwardly protruded through the parallel portion 142b.

The extension portion 328 may have the threads 32a only in a region where the extension portion 328 is disposed within the first fixing hole 144, without having the threads 32a in a region where the extension portion 328 is protruded outwardly of the parallel portion 142b. In this instance, it may be possible to uniformly apply pressure to the extension portion 328 when a rivet portion ("326" in FIG. 3C) is subsequently formed. Of course, the embodiments of the invention are not limited to the above-described structure. For example, the threads 32a may be formed throughout the entire inner surface of the extension portion 328. In addition, various alternatives may be employed.

Thereafter, under the condition that the nut portion 322 is in close contact with one side of the parallel portion 142b (an upper side in FIG. 3B), pressure is applied to the outwardly-protruded extension portion 328 at the other side of the parallel portion 142b (a lower side in FIG. 3B). Pressure application may be achieved in accordance with various methods. For example, a pressing method may be used. In accordance with pressure application, an outwardly-protruded part of the extension portion 328 forms the rivet portion 326 while being pressed onto the other side of the parallel portion 142b, as shown in FIG. 3C.

As a result, the first fastening member 32 includes the nut portion 322 contacting the frame 14 (in more detail, one side of the parallel portion 142b), a connecting portion 324 extending from the nut portion 322 while being disposed within the first fixing hole 144, and the rivet portion 326 extending from the connecting portion 326 while contacting the frame 14 (in more detail, the other side of the parallel portion 142b). Accordingly, since the parallel portion 142b is interposed between the nut portion 322 and the rivet portion 326, the first fastening member 32 is coupled to the frame 14 (in more detail, the parallel portion 142b) to integrate the same and prevent separation therebetween.

The ratio of a length T3 of the rivet portion 326 to the length T1 of the parallel portion 142b, T3/T1, may be 0.6 to 1.5. When the ratio T3/T1 is less than 0.6, it may be difficult to stably fix the first fastening member 32 to the parallel portion 142b because the length T3 of the rivet portion 326 is excessively short. On the other hand, when the ratio T3/T1 exceeds 1.5, it may be difficult to form the rivet portion 326 because the length T3 of the rivet portion 326 is excessively long. In the latter instance, manufacturing costs may increase due to an increase in the amount of materials used. Accordingly, the ratio T3/T1 may be 0.6 to 1.5 (for example, 0.8 to 1.2), taking into consideration stable fixing of the first fastening member 32 and reduction in manufacturing costs. Of course, these numerical values are not absolute. If necessary or desired, the ratio T3/T1 may have other values.

As described above, the first fastening member 32 may be a lock nut. That is, the first fastening member 32 may be a nut having an anti-loosening function. Such a lock nut may be implemented using various methods.

For example, there may be a thread deformation method in which a part of the threads 32a have a shape deformed from an original shape and, as such, the deformed threads 32a are recovered to have the original shape when fastened, thereby generating an increased frictional force and thus preventing loosening. Also, there may a double nut method in which the nut portion 322 is divided into two parts, a filler insertion method in which a separate filler member is inserted and, as such, the filler member generates increased frictional force when deformed, thereby preventing loosening, and a locking method in which rotation of the nut is prevented using a split pin or the like. Various lock nuts will be described in detail with reference to FIGS. 4A to 4F. FIGS. 4A to 4F are views illustrating nut portions and/or connecting portions of various first fastening members applicable to the solar cell module and photovoltaic power generation system according to the illustrated embodiment of the are invention. In each of FIGS. 4A to 4F, only the nut portion 322 is shown or the nut portion 322 and connecting portion 324 are partially or completely shown, for convenience of description.

Figure 4A:
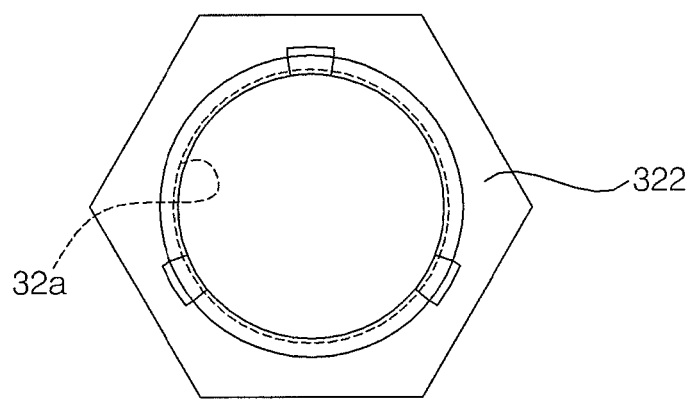
FIGS. 4A to 4F are views illustrating nut portions and/or connecting portions of various first fastening members applicable to the solar cell module and photovoltaic power generation system according to illustrated embodiments of the invention.
Figure 4B:
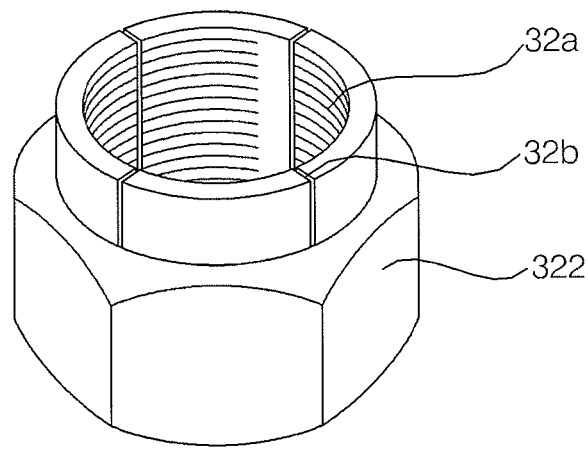
Figure 4C:
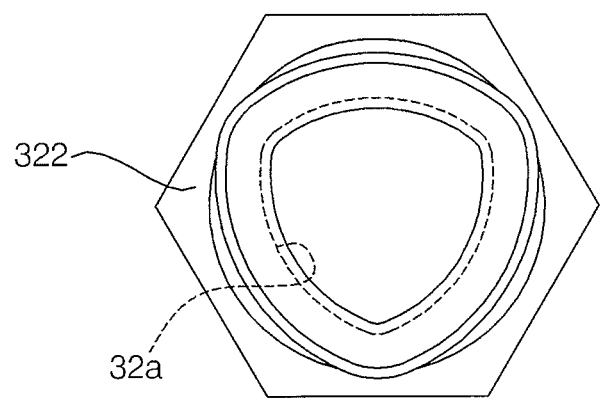

Referring to FIG. 4A, anti-loosening may be implemented using a method of locally deforming portions of each thread 32a (for example, three portions) spaced from one another by the same angle (for example, 120°) when viewed on a plane. In another example, as shown in FIG. 4B, anti-loosening may be implemented by forming slits 32b at the threads 32a, and deforming the nut portion 322 such that the size thereof is radially reduced. In this instance, the nut portion 322 generates a force in a direction opposite to a widening direction during a fastening operation, thereby achieving anti-loosening. In another example, as shown in FIG. 4C, anti-loosening may be implemented using a method of pressing each thread 32a such that portions of the thread 32a (for example, three portions) spaced from one another by the same angle (for example, 120°) are radially protruded, as compared to other portions of the thread 32a. In addition, lock nuts having various thread deformation structures may be employed.

Figure 4D:
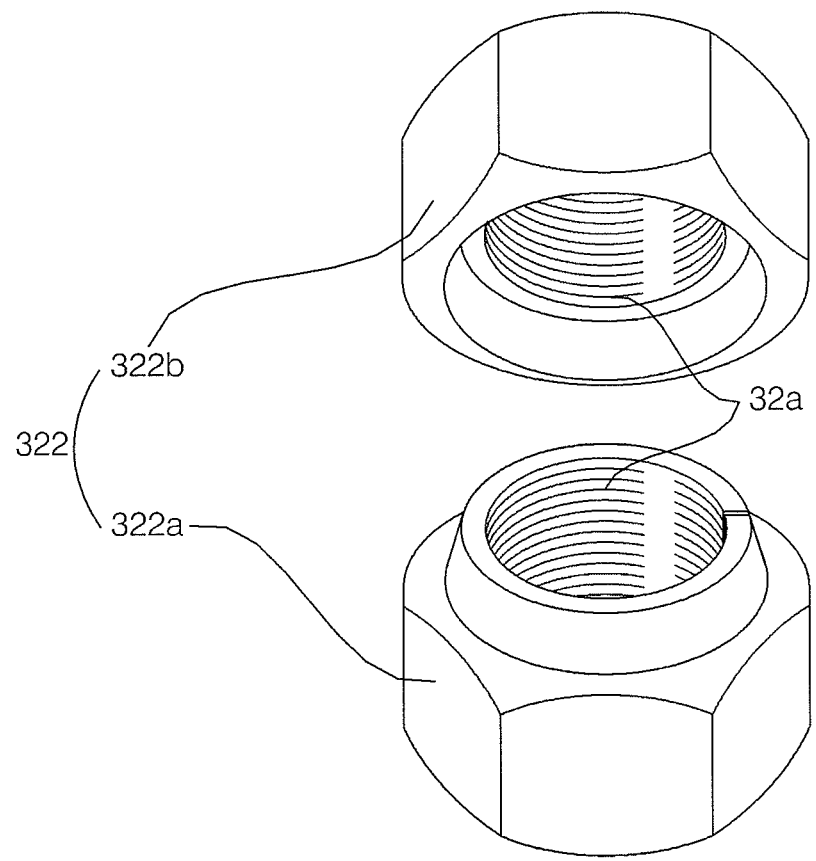

In addition, as shown in FIG. 4D, anti-loosening may be implemented using a double nut method. In this instance, a lower nut 322a having an eccentric upper sliding surface and an upper nut 322b having a concentric lower sliding surface are threadedly coupled. Using this structure, it is possible to prevent the nuts from being loosened in accordance with the wedge principle.

Figure 4E:
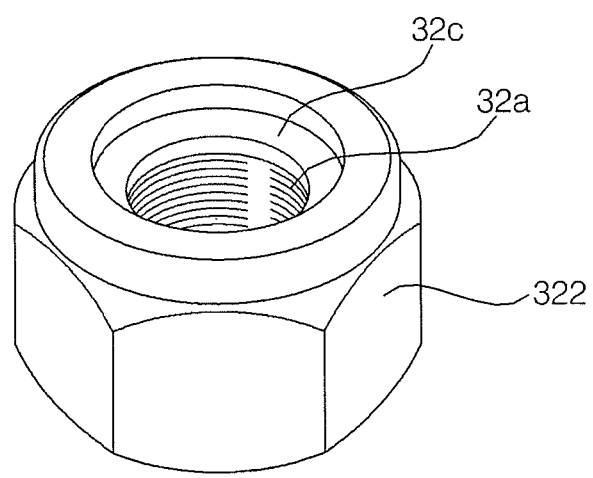
Figure 4F:
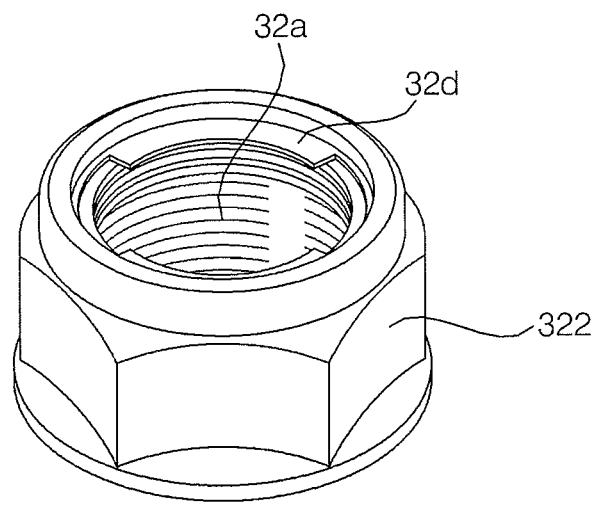

In addition, anti-loosening may be implemented using a method of inserting a resin insert 32c into the nut portion 322, as shown in FIG. 4E. Also, anti-loosening may be implemented using a method of inserting a plate spring 32d into the nut portion 322. In this instance, the plate spring 32d is deformed to press the threads 32a, thereby achieving anti-loosening.

Also, lock nuts of various types may be used as the first fastening member 32.

The filler insertion method may cause an increase in the number of constituent elements and complication of the process because a separate member is required. In this regard, when the thread deformation method or the double nut method is used, it may be possible to reduce the number of constituent elements, and thus to reduce manufacturing costs while preventing complication of the process. In accordance with an embodiment of the invention, the first fastening member 32 may be implemented using a lock nut, which is manufactured in accordance with the thread deformation method or double nut method such that it can be fastened and unfastened multiple times (for example, 5 times or more).

A second fixing hole 24 may be formed through the support member 20 at a position corresponding to the first fixing hole 144. The second fixing hole 24 may be formed before fastening of the second fastening member 34. Alternatively, the second fixing hole 24 may be formed simultaneously with fastening of the second fastening member 34. In the latter instance, the second fixing hole 24 may be formed, at an inner surface thereof, with threads corresponding to the threads 34a of the second fastening member 34.

Again referring to FIGS. 1 and 2, each second fastening member 34 is inserted into the corresponding first fixing hole 144 through the corresponding second fixing hole 24. For example, the second fastening member 34 may be a bolt which can be coupled to a nut. That is, the second fastening member 34 may include a head portion 342 having a larger area than the first and second fixing holes 144 and 24, and a bolt portion 344 formed with threads 34a engagable with the threads 32a of the corresponding first fastening member 32. The threads 34a of the second fastening member 34 extending through the corresponding support member 20 are engaged with the threads 32a of the first fastening member 32 disposed at the corresponding solar cell module 10 and, as such, the solar cell module 20 and support member 20 are fastened to each other.

An auxiliary fastening member 36 may be interposed between the support member 20 and the head portion 342 of the second fastening member 34 in order to achieve an enhancement in fastening force. As the auxiliary fastening member 36, a washer of various types or various structures may be used.

In the illustrated embodiment, the first fastening members 32 are fixed to the frame 14 (in more detail, the parallel portion 412b) to integrate the same. In this regard, it is possible to fix the solar cell module 10 to the support members 20, using a simple process including placing the support members 20 on the solar cell module 10, and fastening the second fastening members 34 to the corresponding first fastening members 32, respectively.

Since the first fastening members 32 are fixed in a riveted manner to prevent separation thereof, it is possible to further enhance fixing stability through a simple process. That is, it is possible to enhance stability while reducing manufacturing costs, as compared to the instance of using a separate adhesive.

Since a lock nut is employed as each first fastening member 32, it is possible to prevent the second fastening members 34 from being separated from the corresponding first fastening members 32 even when impact is applied to the solar cell modules 10 or photovoltaic power generation system 100. Accordingly, it is possible to prevent the solar cell modules 10 from being damaged due to loosening of the fasteners 30. It is also possible to prevent the electricity generation rate of the solar cell modules 10 from being reduced due to generation of vibrations caused by loosening of the fasteners 30. Thus, it is possible to enhance stability and efficiency of the photovoltaic power generation system 100.

As described above, the lock nuts used as the first fastening members 32 can be fastened and unfastened multiple times. For change of the installation position of the photovoltaic power generation system 100 or inspection of the solar cell modules 10, accordingly, it is possible to separate the solar cell modules 10 from the support member 20 and then to again assemble the solar cell modules 10 to the support member 20.

In the above-described embodiment, two support members 20 are arranged with respect to the longer sides of each solar cell module 10 such that one support member 20 is disposed at an upper portion of the solar cell module 10, and the other support member 20 is disposed at a lower portion of the solar cell module 10. Thus, fasteners 30 are arranged with respect to each solar cell module 10 such that two fasteners 30 are arranged at opposite sides of the upper portion of the solar cell module 10, respectively, and another two fasteners 30 are arranged at opposite sides of the lower portion of the solar cell module 10, respectively. Of course, the above-described arrangements are only illustrative. The number and positions of the support members 20 with respect to each solar cell module 120 and the number and positions of the fasteners 30 associated therewith may be varied.

Hereinafter, fasteners of the photovoltaic power generation system according to another embodiment of the invention will be described in detail with reference to FIGS. 5 and 6. In the following description, no detailed description will be given of configurations identical or much similar to those of the above-described embodiment. A detailed description will be given only of configurations different from those of the above-described embodiment.

Figure 5:
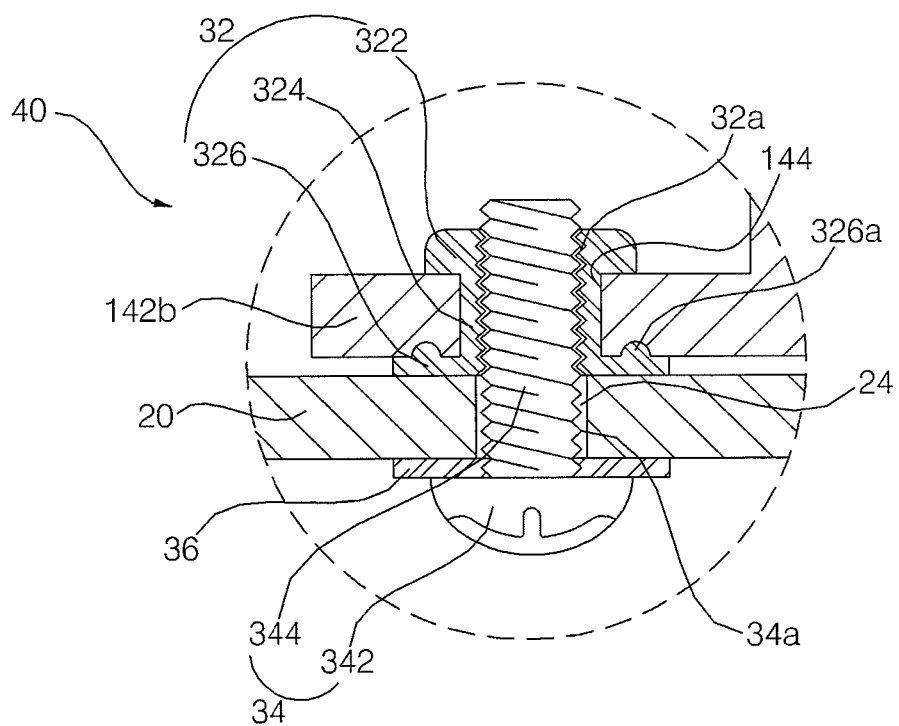
FIG. 5 is an enlarged view of a fastener applicable to the photovoltaic power generation system in accordance with another embodiment of the invention.
Figure 6A:
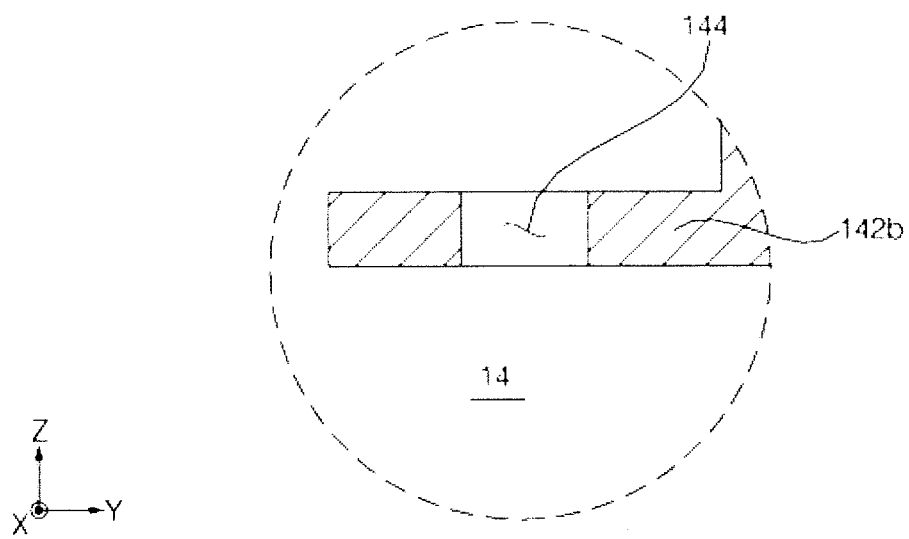
FIGS. 6A to 6C are sectional views illustrating a method for coupling a first fastening members to the solar cell module in a riveted manner to integrate the same in accordance with another embodiment of the invention.
Figure 6B:
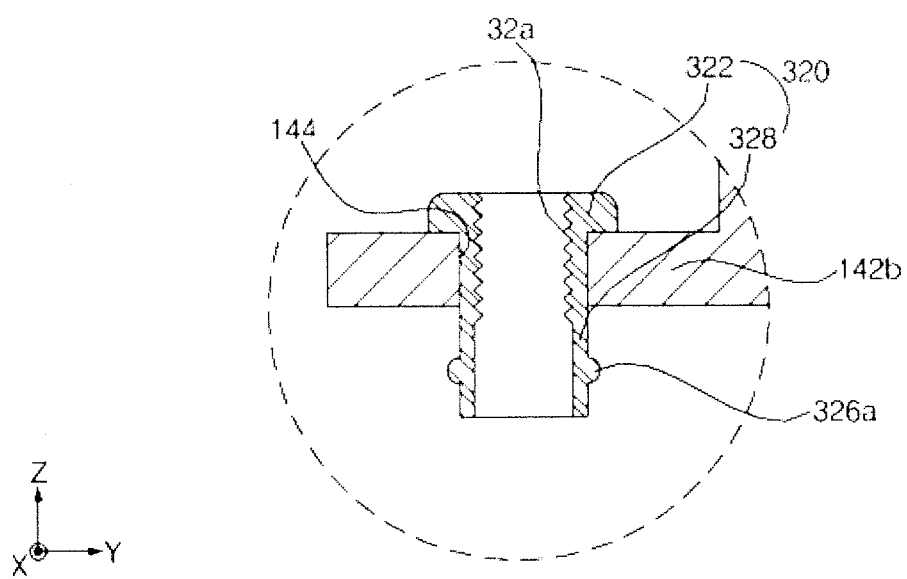
Figure 6C:
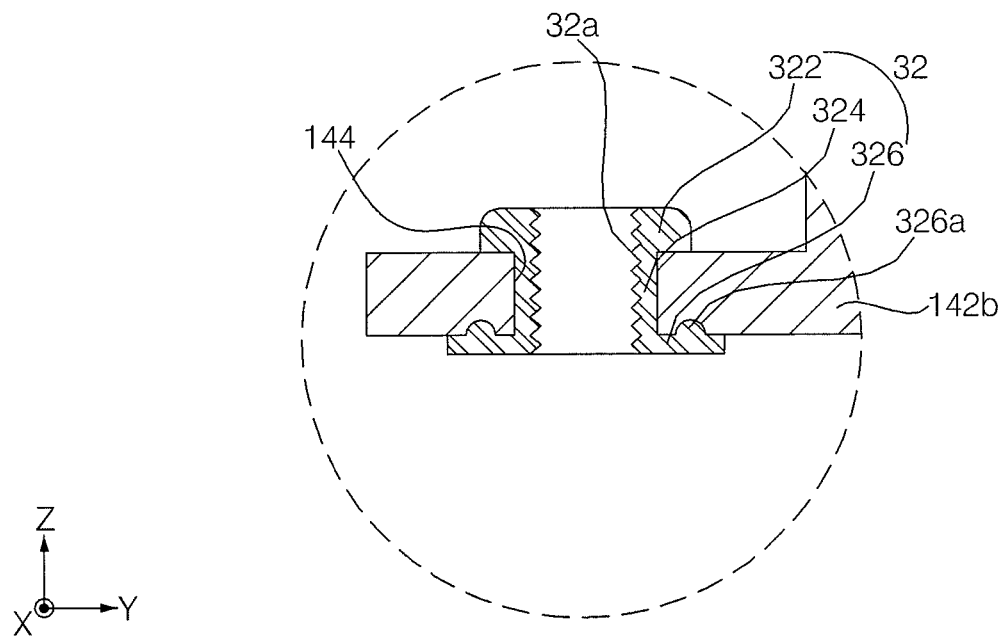

FIG. 5 is an enlarged view of a fastener applicable to the photovoltaic power generation system in accordance with another embodiment of the invention. FIGS. 6A to 6C are sectional views illustrating a method for coupling the first fastening members to the solar cell module in a riveted manner to integrate the same in accordance with another embodiment of the invention.

Referring to FIG. 5, in accordance with the illustrated embodiment, each first fastening member 32 is formed, at a portion thereof corresponding to the rivet portion 326, with lugs 326a protruded toward the parallel portion 142b of the frame 14. When pressure is applied to the first fastening member 32, using a press or the like, for formation of the rivet portion 326, the lugs 326a are stuck into the parallel portion 142b. Thus, fixing stability of the first fastening member 32 fixed to the frame 14 can be further enhanced. The lugs 326a may be formed in plural at the portion of the first fastening member 32 corresponding to the rivet portion 326. The lugs 326a may also be arranged in a symmetrical manner.

The first fastening member 32 according to this embodiment may be fixed to the frame 14 to integrate the same, using a method similar to the method described in conjunction with FIGS. 3A to 3C.

That is, a frame 14 including a parallel portion 142b is first prepared, as shown in FIG. 6A.

Thereafter, as shown in FIG. 6B, the nut 320 is then inserted into the first fixing hole 144 such that the extension portion 328 of the nut 320 is disposed within the first fixing hole 144. In this state, lugs 326a, which are protruded from an outer surface of the extension portion 328, are exposed outwardly of the first fixing hole 144. The width of the extension portion 328 in a region where the lugs 326a are formed may be almost equal to or less than the width of the first fixing hole 144. Alternatively, the width of the extension portion 328 in a region where the lugs 326a are not formed may be almost equal to the width of the first fixing hole 144. In this instance, when force is applied to the nut 320, to forcibly insert the extension portion 328 into the first fixing hole 144, the extension portion 328 is slightly deformed in a radially inward direction and, as such, the extension portion 328 can pass through the first fixing hole 144.

Subsequently, under the condition that the nut portion 322 is in close contact with one side of the parallel portion 142b (an upper side in FIG. 6B), pressure is applied to the outwardly-protruded extension portion 328 at the other side of the parallel portion 142b (a lower side in FIG. 6B). In accordance with pressure application, an outwardly-protruded part of the extension portion 328 forms the rivet portion 326 while being pressed onto the other side of the parallel portion 142b, as shown in FIG. 6C. In this instance, the lugs 326a disposed at the rivet portion 326 are stuck into the parallel portion 142b at the other side of the parallel portion 142b. Thus, fixing stability of the first fastening member 32 fixed to the frame 14 can be further enhanced.

In the illustrated embodiment, the first fastening members are fixed to the frame (for example, to integrate the same). In this regard, it is possible to fix the solar cell module to the support members, using a simple process including placing the support members on the solar cell module, and fastening the second fastening members to the first fastening members, respectively. Since the first fastening members are fixed in a riveted manner to prevent separation thereof, it is possible to further enhance fixing stability through a simple process. That is, it is possible to enhance stability while reducing manufacturing costs, as compared to the instance of using a separate adhesive.

Since a lock nut is employed as each first fastening member, it is possible to prevent the solar cell modules 10 from being damaged due to loosening of the fasteners 30. It is also possible to prevent the electricity generation rate of the solar cell modules 10 from being reduced. Since the lock nuts used as the first fastening members can be fastened and unfastened multiple times, it is possible to separate the solar cell modules from the support member and then to again assemble the solar cell modules to the support member.

Although the example embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A solar cell module comprising:
   a solar cell panel; and
   a frame disposed at a periphery of the solar cell panel, the frame comprising a first section for receiving at least a portion of the solar cell panel and a second section outwardly extending from the first frame,
   wherein a first fixing hole is formed at the second section of the frame, and a first fastening member is coupled to the first fixing hole,
   wherein the first fastening member comprises a nut undetachably fixed to the frame in a riveted manner and including threads at an inner surface thereof,
   wherein a support member for fixing the second section, and for connecting and fixing the solar cell module to another adjacent solar cell module is fixed to the first fixing hole by fastening a second fastening member to the first fastening member while interposing the support member between the first and second fastening members,
   wherein the support member is positioned on the second section and the first fastening member and includes a second fixing hole corresponding to the first fixing hole,
   wherein the second section comprises a vertical portion extending in perpendicular to the solar cell panel, and a parallel portion extending in parallel to the solar cell panel,
   wherein the first fixing hole and the first fastening member are disposed at the parallel portion,
   wherein the first fastening member is solely coupled and fixed to the first fixing hole to be fixed to the frame,
   wherein the second fastening member entirely penetrates the support member in a thickness direction of the support member,
   wherein the second fastening member constitutes a bolt extending through the nut of the first fastening member and the second fixing hole of the support member to be fastened to the threads of the first fastening member for fixing the frame to the support member,
   wherein the first fastening member constitutes a lock nut,
   wherein the threads of the lock nut have a deformed shape, have slits, and include portions spaced from one another and radially protruded, and
   wherein the lock nut comprises a double nut including a lower nut having an eccentric upper sliding surface and an upper nut having a concentric lower sliding surface that are threadedly coupled, or a resin insert of a plate spring inserted into the threads of the lock nut.

2. The solar cell module according to claim 1, wherein the fastening member comprises a nut portion disposed at one surface of the frame having a larger outer diameter than a diameter of the first fixing hole, a connecting portion extending from the nut portion, to be disposed within the first fixing hole, and a rivet portion disposed at the other surface of the frame while having a larger outer diameter than the diameter of the first fixing hole.

3. The solar cell module according to claim 2, wherein the nut portion and the rivet portion extend orthogonal to the connecting portion.

4. The solar cell module according to claim 2, wherein the first fastening member further comprises lugs provided at the rivet portion, to be protruded toward the other surface of the frame.

5. The solar cell module according to claim 1, wherein the first fastening member has an integrated structure in which all portions thereof are made of the same material.

6. A photovoltaic power generation system comprising:
a solar cell module comprising a solar cell panel, and a frame disposed at a periphery of the solar cell panel, the frame comprising a first section for receiving at least a portion of the solar cell panel and a second section outwardly extending from the first frame;
a support member for fixing the second section; and
a fastener for fastening the solar cell module and the support member to each other,
wherein the fastener comprises
a first fastening member coupled to a first fixing hole formed at the second section of the frame, and
a second fastening member connected to the support member and fastened to the first fastening member,
wherein the first fastening member constitutes a nut undetachably fixed to the frame in a rivet manner and including threads at an inner surface thereof,
wherein the solar cell module comprises a plurality of solar cell modules, and the support member cross the plurality of solar cell modules so that the plurality of solar cell modules are connected and fixed together via the support member,
wherein the support member is positioned on the second section and the first fastening member and includes a second fixing hole corresponding to the first fixing hole,
wherein the second section comprises a vertical portion extending in perpendicular to the solar cell panel, and a parallel portion extending in parallel to the solar cell panel,
wherein the first fixing hole and the first fastening member are positioned at the parallel portion,
wherein the second fastening member extends from a rear side of the solar cell module, penetrates the support member, and is coupled to the first fastening member,
wherein the first fastening member is solely coupled and fixed to the first fixing hole to be fixed to the frame,
wherein the second fastening member entirely penetrates the support member in a thickness direction of the support member,
wherein the second fastening member constitutes a bolt extending through the nut of the first fastening member and the second fixing hole of the support member to be fastened to the threads of the first fastening member for fixing the frame to the support member,
wherein the first fastening member constitutes a lock nut,
wherein the threads of the lock nut have a deformed shape, have slits, and include portions spaced from one another and radially protruded, and
wherein the lock nut comprises a double nut including a lower nut having an eccentric upper sliding surface and an upper nut having a concentric lower sliding surface that are threadedly coupled, or a resin insert of a plate spring inserted into the thread of the lock nut.

7. The photovoltaic power generation system according to claim 6, wherein:
the fastener further comprises an auxiliary fastening member interposed between the first fastening member and the support member; and
the auxiliary fastening member constitutes a washer.

8. The photovoltaic power generation system according to claim 6, wherein the first fastening member comprises a nut portion disposed at one surface of the frame having a larger outer diameter than a diameter of the first fixing hole, a connecting portion extending from the nut portion, to be disposed within the first fixing hole, and a rivet portion disposed at the other surface of the frame while having a larger outer diameter than the diameter of the first fixing hole.

9. The photovoltaic power generation system according to claim 8, wherein the nut portion and the rivet portion extend orthogonal to the connecting portion.

10. The photovoltaic power generation system according to claim 8, wherein the first fastening member further comprises lugs provided at the rivet portion, to be protruded toward the other surface of the frame.

11. The photovoltaic power generation system according to claim 6, wherein the first fastening member has an integrated structure in which all portions thereof are made of the same material.

* * * * *